(12) United States Patent
Lee et al.

(10) Patent No.: US 9,543,369 B2
(45) Date of Patent: Jan. 10, 2017

(54) DISPLAY DEVICE

(71) Applicant: Japan Display Inc., Tokyo (JP)

(72) Inventors: HaoChun Lee, Tokyo (JP); Toshihiro Sato, Tokyo (JP); Masaya Adachi, Tokyo (JP); Shigeru Sakamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/063,793

(22) Filed: Mar. 8, 2016

(65) Prior Publication Data

US 2016/0276421 A1 Sep. 22, 2016

(30) Foreign Application Priority Data

Mar. 17, 2015 (JP) ................................ 2015-053320

(51) Int. Cl.
*H01L 29/00* (2006.01)
*H01L 27/32* (2006.01)
*H01L 51/52* (2006.01)
*H01L 29/786* (2006.01)
*H01L 33/58* (2010.01)

(52) U.S. Cl.
CPC ......... *H01L 27/3272* (2013.01); *H01L 27/322* (2013.01); *H01L 27/326* (2013.01); *H01L 27/3213* (2013.01); *H01L 27/3218* (2013.01); *H01L 27/3244* (2013.01); *H01L 27/3246* (2013.01); *H01L 27/3248* (2013.01); *H01L 29/78633* (2013.01); *H01L 33/58* (2013.01); *H01L 51/524* (2013.01); *H01L 2924/12041* (2013.01)

(58) Field of Classification Search
CPC ............. H01L 27/3248; H01L 27/3246; H01L 27/326; H01L 27/3244; H01L 29/78633; H01L 33/58; H01L 2924/12041
See application file for complete search history.

(56) References Cited

U.S. PATENT DOCUMENTS

| 2011/0227846 A1* | 9/2011 | Imazeki ................. G06F 3/044 345/173 |
| 2011/0227847 A1* | 9/2011 | Yoshiyama ............. G06F 3/041 345/173 |
| 2012/0249901 A1 | 10/2012 | Sekine |
| 2015/0090988 A1* | 4/2015 | Oooka ................ H01L 51/5228 257/40 |

(Continued)

FOREIGN PATENT DOCUMENTS

| JP | 2005-085737 A | 3/2005 |
| JP | 2009-204898 A | 9/2009 |

(Continued)

*Primary Examiner* — Ngan Ngo
(74) *Attorney, Agent, or Firm* — Typha IP LLC

(57) ABSTRACT

A display device includes a plurality of pixels each including a light emitting region; and a light blocking layer provided on a side of the plurality of pixels on which light is output. In each of the plurality pixels, the light blocking layer has a plurality of openings allowing light from the light emitting region to be output. In one embodiment, in the light blocking layer, the openings adjacent to each other may be located line-symmetrically. In one embodiment, in the light blocking layer, the openings adjacent to each other may be located point-symmetrically.

7 Claims, 16 Drawing Sheets

(56) References Cited

U.S. PATENT DOCUMENTS

| | | | | |
|---|---|---|---|---|
| 2016/0033816 A1* | 2/2016 | Yoon | ............... | G02F 1/133512 349/108 |
| 2016/0071910 A1* | 3/2016 | Sasaki | ............... | H01L 27/3213 257/89 |
| 2016/0211311 A1* | 7/2016 | Sato | ............... | H01L 27/3272 |

FOREIGN PATENT DOCUMENTS

| | | |
|---|---|---|
| JP | 2009-288735 A | 12/2009 |
| JP | 2012-215830 A | 11/2012 |

\* cited by examiner

DISPLAY DEVICE

CROSS REFERENCE TO RELATED APPLICATIONS

This application is based upon and claims the benefit of priority from the prior Japanese Patent Application No. 2015-053320 filed on Mar. 17, 2015, the entire contents of which are incorporated herein by reference.

FIELD

The present invention relates to a display device, and an embodiment of the present invention relates to a pixel structure of a display device.

BACKGROUND

An organic electroluminescence (hereinafter, referred to as "organic EL") display device includes a light emitting element provided in each of pixels and displays an image by controlling light emission of each of the light emitting elements independently. The light emitting element has a structure in which a layer containing an organic EL material (hereinafter, also referred to as a "light emitting layer") is interposed between a pair of electrodes, one of which is an anode electrode and the other of which is a cathode electrode.

In such an organic EL display device, one of the electrodes is provided in each pixel as an individual pixel electrode, and the other electrode is provided over a plurality of pixels as a common pixel electrode supplied with a common potential. The organic EL display device provides a potential to the individual pixel electrode provided in each pixel independently, as opposed to the potential of the common pixel electrode, and thus controls the light emission of the pixels.

An EL display device, especially, an organic EL display device realizing full-color display with a combination of a white light emitting element and color filters, generally includes an array substrate and a color filter substrate that are assembled together. The array substrate includes a plurality of light emitting elements arrayed in rows and columns. The color filter substrate includes color filters of three colors, namely, R (red), green (G) and blue (B), and a light-blocking layer (also referred to as a "black matrix") demarcating the color filters of the three colors.

Occasionally in a display device, an R (red) pixel, a G (green) pixel and a B (blue) pixel are each used as a sub pixel, and a group of these sub pixels is used as one pixel. In such display devices, various arrangements are made on a structure of pixels including the sub pixels in order to improve the display quality. For example, Japanese Laid-Open Patent Publication No. 2012-215830 discloses demarcating pixels by a black matrix. In a liquid crystal display device, a light blocking portion is projected via a cylindrical lens toward a viewer and is visually recognized as a black area. Such black areas are existent intermittently to cause a moire. The above-described arrangement is made in order to prevent this problem and also to solve insufficient write of signals to the pixels. Japanese Laid-Open Patent Publication No. 2009-204898 discloses that each of a plurality of sub pixels is driven at two gray levels and that each sub pixel is divided into two areas having an equal area size and each of the divided areas is driven independently at two gray levels. Such arrangements are made in order to realize various modes of display. Japanese Laid-Open Patent Publication No. 2005-085737 discloses dividing each of sub pixels into two areas having an equal area size in an organic EL display device. This arrangement is made in order to prevent excessive temperature rise and thus prevent increase in the light emitting area size of each of pixel areas and also in order to prevent black lines from being widened and thus prevent decrease in display performance. Japanese Laid-Open Patent Publication No. 2009-288735 discloses dividing each of sub pixels into two areas having an equal area size for the following purpose. In the case where a part of the pixel is arranged so as not to be lit up in order to repair a defect, only a divided area having the defect is arranged so as not to be lit up, so that this arrangement is not conspicuous.

SUMMARY

A display device in an embodiment according to the present invention includes a plurality of pixels each including a light emitting region; and a light blocking layer provided on a side of the plurality of pixels on which light is output. In each of the plurality pixels, the light blocking layer has a plurality of openings allowing light from the light emitting region to be output.

DESCRIPTION OF EMBODIMENTS

Figure 1:
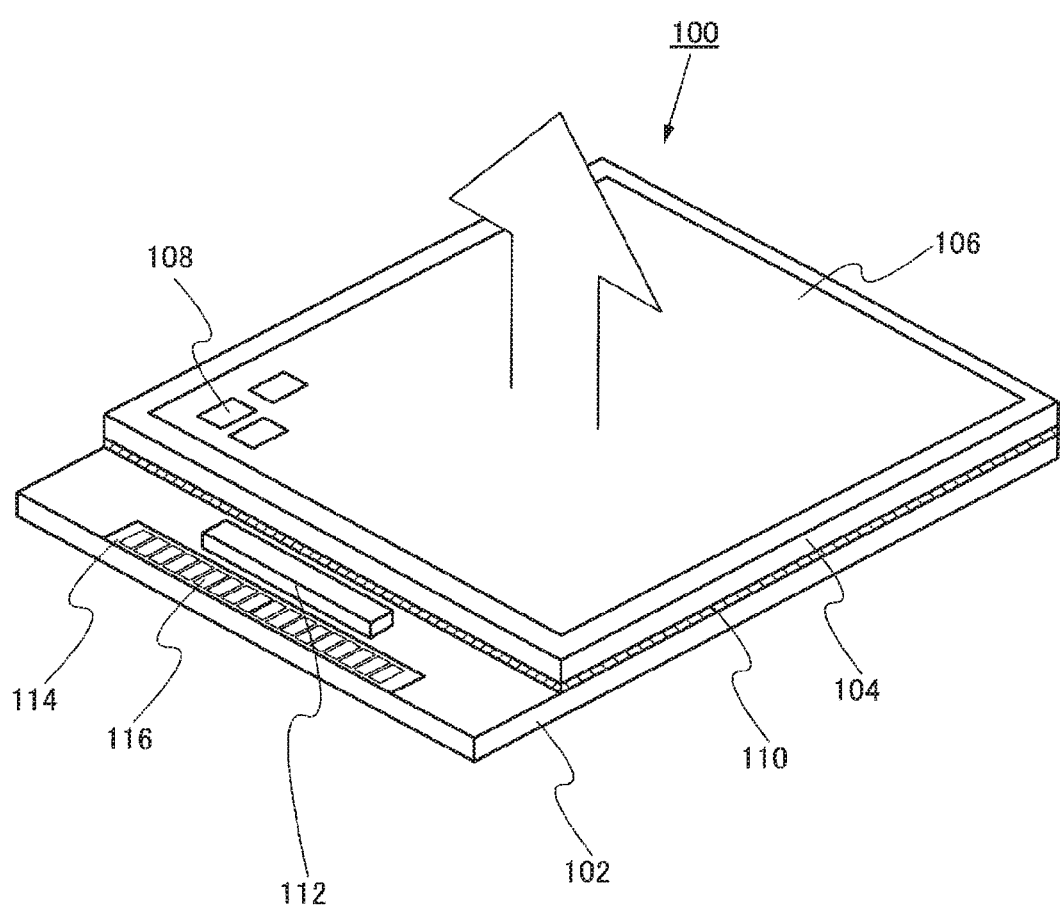
FIG. 1 is a perspective view showing a structure of a display device in an embodiment according to the present invention.

Hereinafter, embodiments of the present invention will be described with reference to the drawings and the like. The present invention may be carried out in various many embodiments, and should not be construed as being limited to any of the following embodiments. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted.

In this specification, an expression that a component or area is "on" another component or area encompasses a case where such a component or area is in contact with the other component or area and also a case where such a component or area is above or below the other component or area, namely, a case where still another component or area is provided between such a component or area and the other component or area, unless otherwise specified.

A light emitting element provided in a pixel of an organic EL display device includes an individual pixel electrode and a common pixel electrode. Among these electrodes, an electrode on the side on which the light is output is light-transmissive, whereas an electrode on the opposite side is light-reflective. There is a problem that a display region of the display device is caused to have a mirror surface by the light-reflective electrode of each pixel.

It is known that one solution to this problem is to provide a circularly polarizing plate at a surface so that external light reflected by the light-reflective electrode is not output from the display device. Conventionally, it has been attempted to solve the problem of reflection of the external light by providing a circularly polarizing plate. However, in the case where such a circularly polarizing plate is used, there occurs another problem that the luminance of light emission is also decreased to half because the circularly polarizing plate absorbs light.

In the case where color filters are provided in the display region, the external light is suppressed from being seen on the mirror surface. However, color filter are colored red (R), green (G) and blue (B), and there occurs a problem that the reflected external light is colored when no display is provided.

The present invention has an object of providing a display device increasing the light extraction efficiency while solving the problem that the reflected external light is colored.

The present invention has an object of providing a display device which has an increased light extraction efficiency and does not allow the reflected external light to be colored much.

With reference to FIG. 1, a structure of a display device 100 in this embodiment will be described. The display device 100 includes a first substrate 102 including a display region 106. The display region 106 includes an array of a plurality of pixels 108. On a top surface of the display region 106, a second substrate 104 (counter substrate) is provided as a sealing member.

The second substrate 104 is secured to the first substrate 102 by a sealing member 110 surrounding the display region 106. The display region 106 formed in the first substrate 102 is sealed by the second substrate 104 acting as a sealing member and the sealing member 110 so as not to be exposed to air. Such a sealing structure suppresses light emitting elements provided in the pixels 108 from being deteriorated.

The first substrate 102 includes a terminal region 114 along an end thereof. The terminal region 114 is located outer to the second substrate 104. The terminal region 114 includes a plurality of connection terminals 116. At each of the connection terminals 116, a wiring board connecting a device that outputs a video signal, a power supply and the like with a display panel is provided. A contact of the connection terminal 116 with the wiring board is exposed outside. The first substrate 102 may include a driver circuit 112 that outputs a video signal input from the terminal region 114 to the display region 106.

Figure 2:
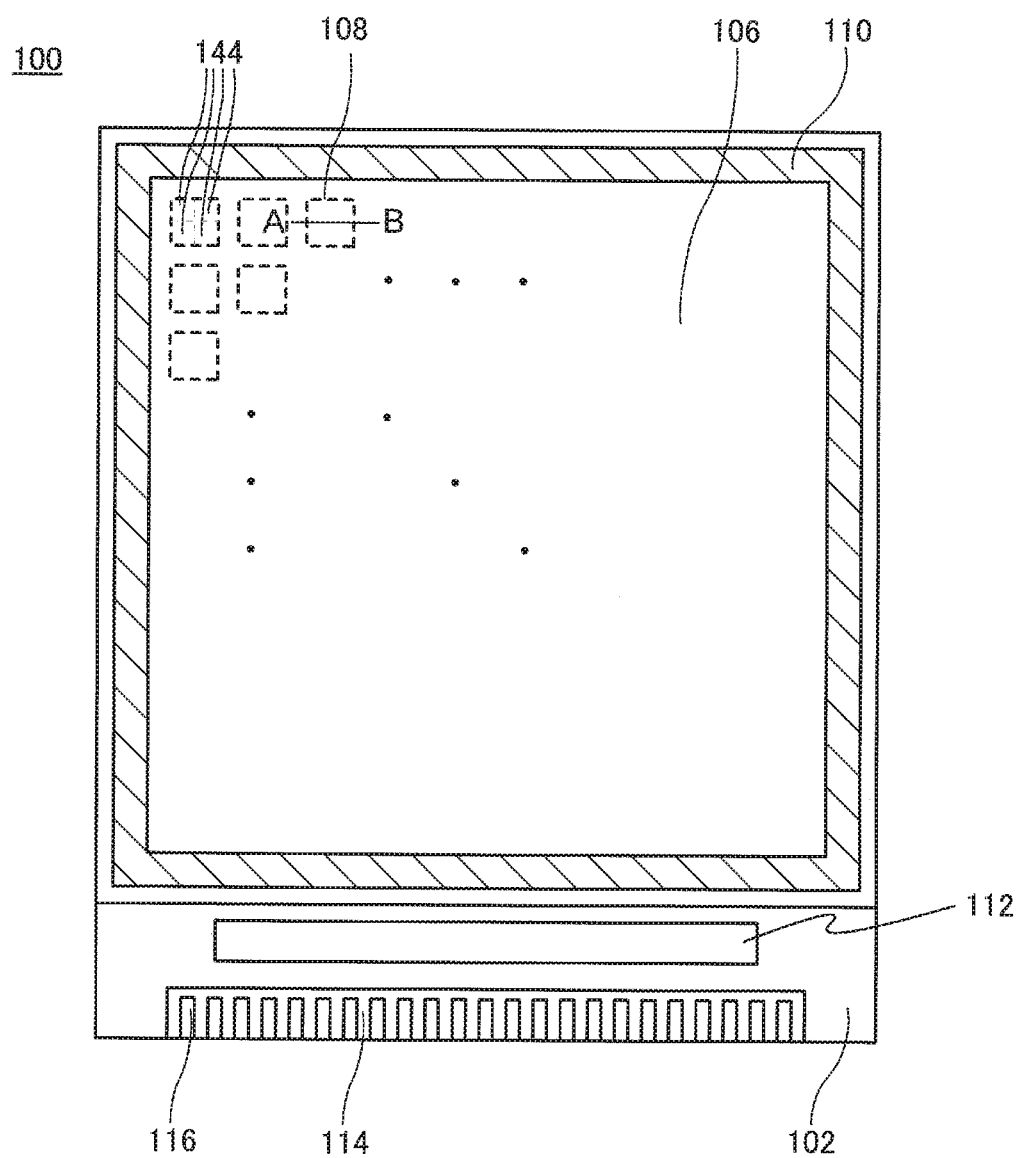
FIG. 2 is a plan view showing the structure of the display device in the embodiment according to the present invention.
Figure 3:
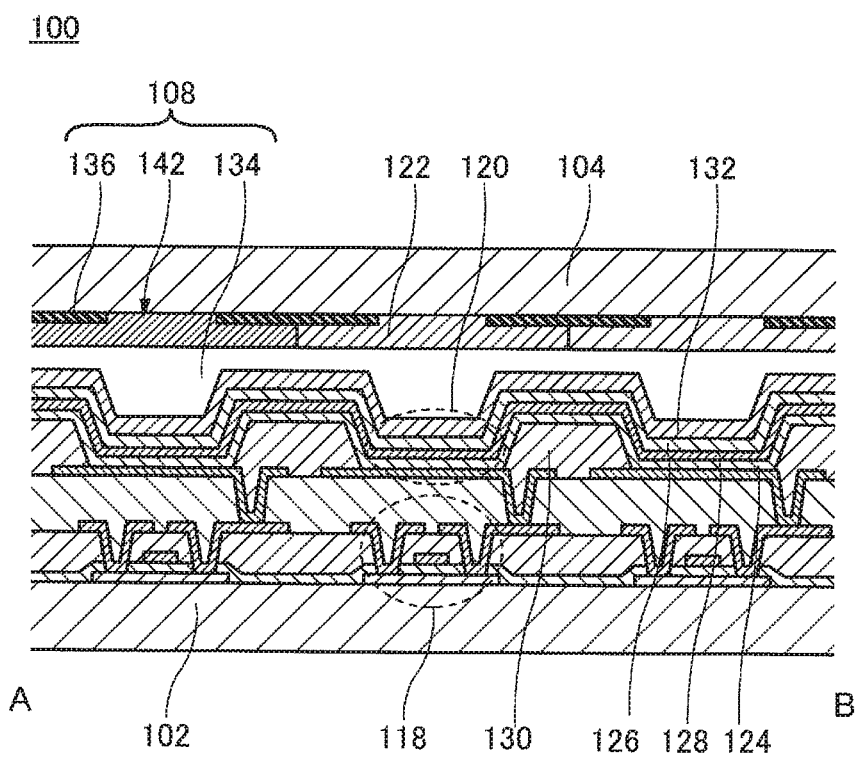
FIG. 3 is a cross-sectional view showing the structure of the display device in the embodiment according to the present invention.
Figure 4:
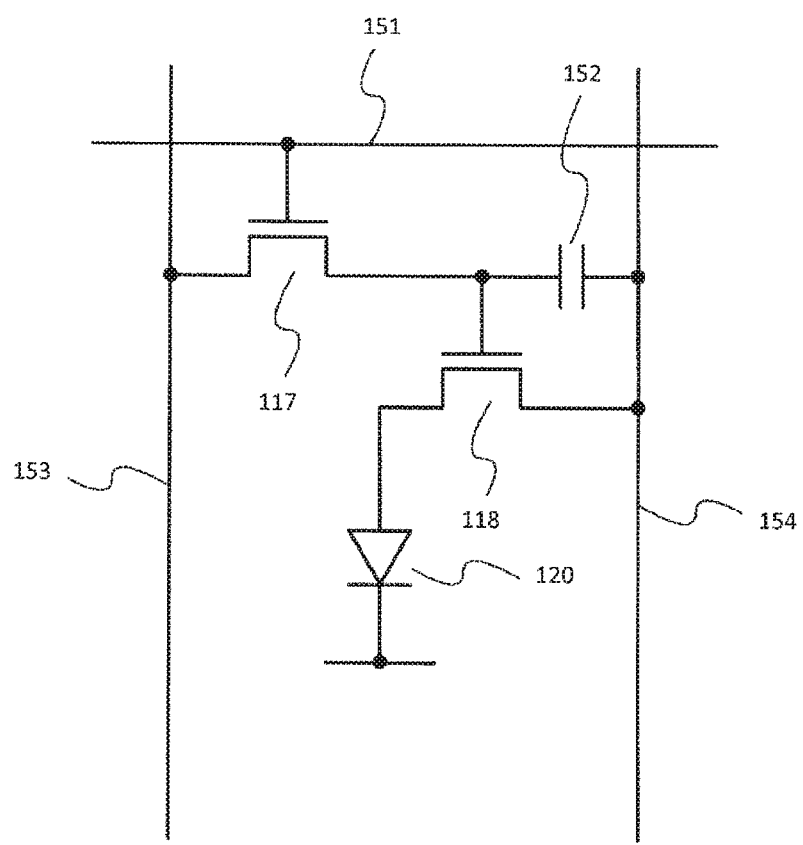
FIG. 4 is an equivalent circuit diagram of the display device in the embodiment according to the present invention.

With reference to FIG. 2 through FIG. 4, the structure of the display device 100 in this embodiment will be described. FIG. 2 is a plan view showing the structure of the display device 100 in this embodiment. FIG. 3 is a cross-sectional view showing the structure of the display device 100 in this embodiment. FIG. 4 is an equivalent circuit diagram of the display device 100 in this embodiment.

As shown in FIG. 2, the display region 106, of the first substrate 102, which forms a display screen includes the plurality of pixels 108 arrayed in rows and columns. On a peripheral area of the first substrate 102, other elements such as a vertical scanning circuit, a horizontal scanning circuit and the like that input signals to the display region 106 may be provided.

FIG. 3 is a cross-sectional view of one pixel of the display device 100 taken along line A-B in FIG. 2. Each of the plurality of pixels includes a plurality of light emitting regions. The plurality of light emitting regions are separated from each other by a bank 130 provided around each of the plurality of light emitting regions. The plurality of light emitting regions each form a sub pixel 144 (FIG. 2) including a selective transistor 117 (FIG. 4), a light emitting element 120 emitting white light, and a color filter 122 of red, green, blue or white provided above the light emitting element 120. The sub pixel emits light of one of these colors.

The light emitting element 120 includes an individual pixel electrode 124 (also referred to simply as the "pixel electrode"), a light emitting layer 128, and a common pixel electrode 126 (also referred to as the "common electrode"), which are stacked in this order. One individual pixel electrode 124 is independently provided in each light emitting element 120. The individual pixel electrode 124 is supplied with a potential via a driving transistor 118. The individual pixel electrodes 124 in different sub pixels are supplied with different potentials. The common pixel electrode 126 is commonly provided for all the light emitting elements 120.

The individual pixel electrode 124 is preferably formed of a material having a high reflectance (e.g., a metal film) in order to allow light generated in the light emitting layer 128 to be reflected toward the common pixel electrode 126. Alternatively, the individual pixel electrode 124 may have a stack structure of a metal film and a light-transmissive conductive film, so that the individual pixel electrode 124 includes a light-reflective surface.

The light emitting layer 128 is commonly provided for the plurality of pixels 108 and covers the individual pixel electrodes 124 and the bank 130 between the sub pixels.

In the case of being formed of, for example, a light emitting organic material, the light emitting layer 128 is formed of a low molecular weight type organic material or a high molecular weight type organic material. In the case where a low molecular weight type organic material is used, the light emitting layer 128 is provided between a hole injection layer/hole transfer layer and an electron transfer layer/electron injection layer. In this embodiment, the light emitting layer 128 is formed of a light emitting material that emits white light, and full-color display is realized by color filters. The light emitting layer 128 may have a so-called tandem structure including a plurality of light emitting layers (e.g., organic EL layers) in a stacked manner.

The common pixel electrode 126 is preferably formed of a transparent conductive material that is light-transmissive and conductive such as ITO (tin oxide-containing indium oxide), IZO (indium oxide-zinc oxide) or the like in order to allow light emitted in the light emitting layer 128 to be transmitted through the common pixel electrode 126. Alternatively, the common pixel electrode 126 may be formed of a metal layer having such a thickness that allows the light emitted in the light emitting layer 128 to be transmitted through the metal layer.

A sealing film 132 is provided on the common pixel electrode 126. The sealing film 132 is preferably an insulating film that blocks entrance of moisture. Such an insulating film may be an inorganic insulating film or an organic insulating film.

In the case where the sealing film 132 is formed of an inorganic insulating film, the sealing film 132 may be formed of silicon oxide ($SiO_x$), silicon nitride ($SiN_x$), silicon oxide nitride ($SiO_xN_y$), silicon nitride oxide ($SiN_xO_y$), aluminum oxide ($AlO_x$), aluminum nitride ($AlN_x$), aluminum oxide nitride ($AlO_xN_y$), aluminum nitride oxide ($AlN_xO_y$) or the like (x and y are each an arbitrary value). The sealing film 132 may have a stack structure of any of these materials. The sealing film 132 formed of such an inorganic material(s) may be formed by plasma CVD or sputtering.

In the case where the sealing film 132 is formed of an organic insulating film, the sealing film 132 may be formed of a polyimide resin, an acrylic resin, an epoxy resin, a silicone resin, a fluorine resin, a siloxane resin or the like. The sealing film 132 may have a stack structure of any of these materials. The sealing film 132 formed of such an organic material(s) may be formed by vapor deposition or vapor deposition polymerization.

The sealing film 132 may have a stack structure of a combination of any of the above-described inorganic and organic insulating materials.

The first substrate 102 is covered with the second substrate 104, which is transparent and is kept away from the first substrate 102 by the sealing member 110 (see FIG. 1). A space enclosed by the second substrate 104, the sealing member 110, and the sealing film 132 is filled with a filler 134 formed of, for example, an epoxy resin, which is transparent.

Although not shown in FIG. 2, the display region 106 is covered with a light blocking layer 136 having a plurality of openings 142. The light blocking layer 136 is located above the color filters 122 (on the side of the second substrate 104). The plurality of openings 142 of the light blocking layer 136 allow light from the light emitting regions to be output.

The pixel 108 includes a plurality of the sub pixels 144. The openings 142 are provided in correspondence with the sub pixels 144.

In FIG. 2, the pixel 108 is a region enclosed by the dashed lines. The pixel 108 is divided into four regions, and each of the four regions is one sub pixel 144. Needless to say, the pixel 108 does not need to be divided into four regions, and may be divided into more than two regions.

FIG. 4 is an equivalent circuit diagram of the pixel shown in FIG. 3. When a selection signal is supplied to a gate signal line 151, the selective transistor 117 supplies a data signal, supplied from a data signal line 153 in synchronization with the selection signal, as a gate potential of the driving transistor 118. A capacitance element 152 maintains the gate potential. The driving transistor 118 is connected with a power supply line 154 and supplies a drain current based on the gate potential to the light emitting element 120. The light emitting element 120 emits light at a luminance based on the drain current.

The equivalent circuit diagram shown in the layout of FIG. 4 and the pixel shown in FIG. 3 are each one example, and the display device according to the present invention is not limited to including such a pixel or such a circuit configuration. For example, a circuit compensating for the threshold voltage of the driving transistor 118 or a switching transistor forcibly terminating the light emission of the light emission element 120 may also be included.

Figure 5:
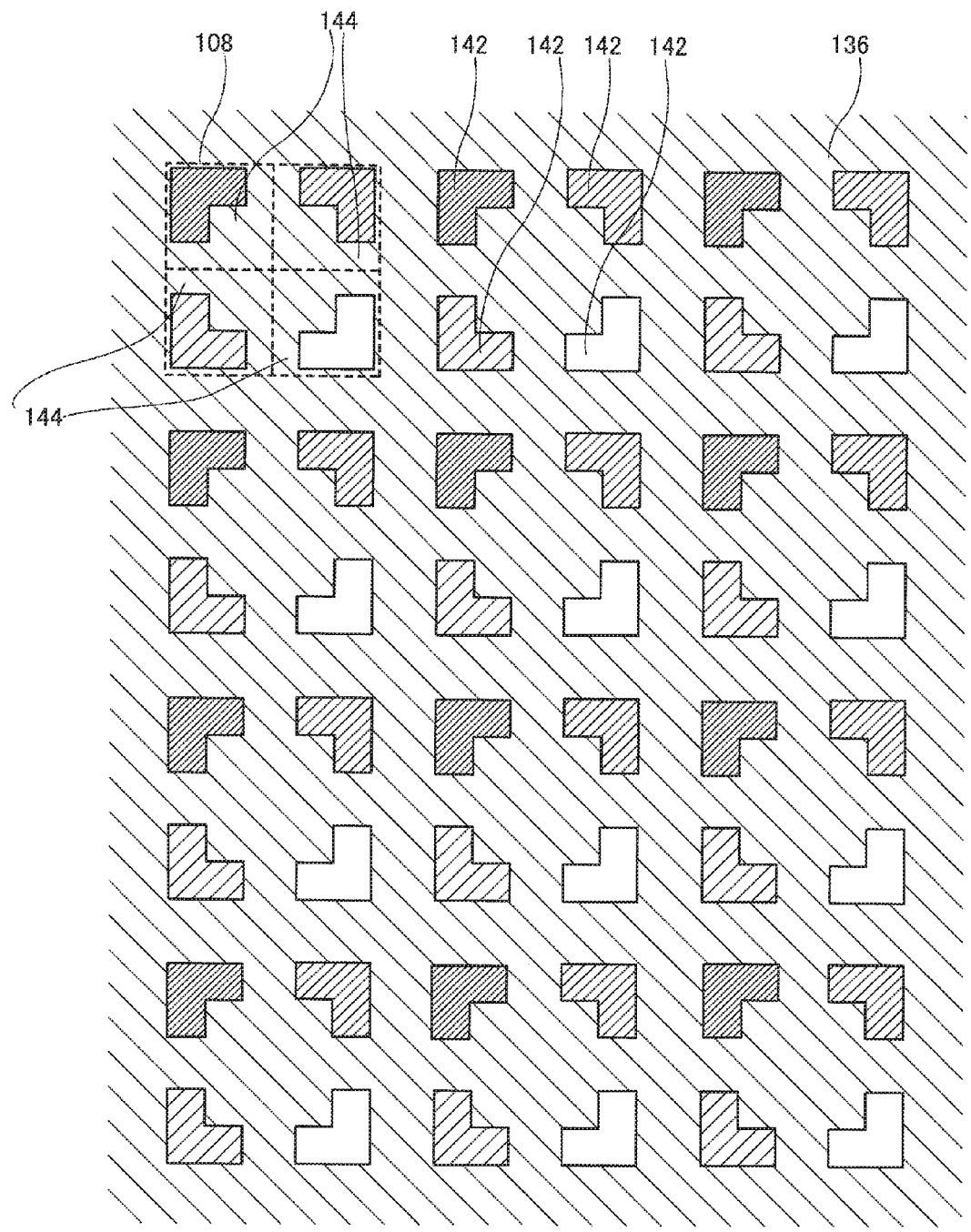
FIG. 5 is a plan view showing an array example of sub pixels in the display device in the embodiment according to the present invention.
Figure 6:
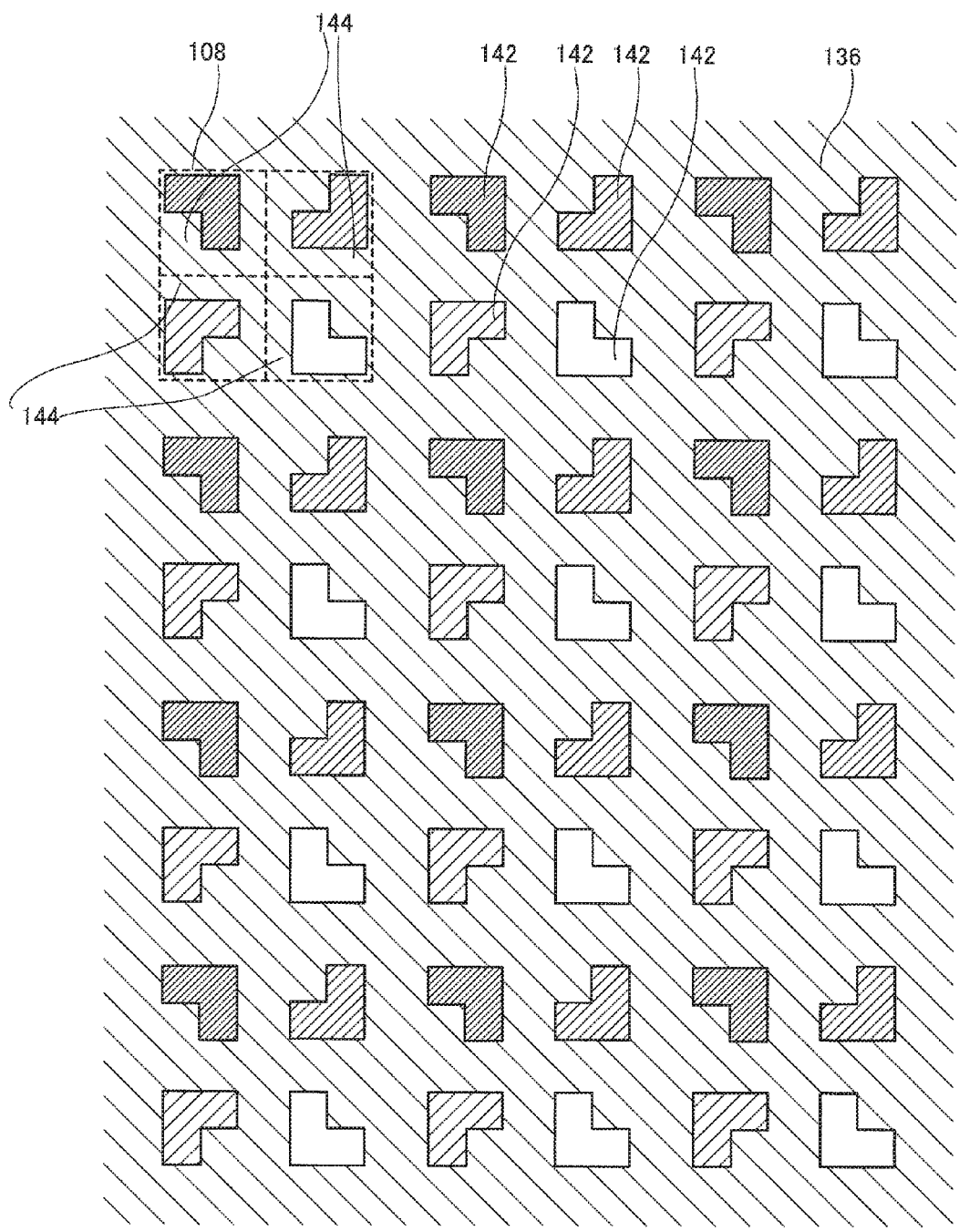
FIG. 6 is a plan view showing an array example of sub pixels in the display device in the embodiment according to the present invention.

FIG. 5 and FIG. 6 show various shapes of the openings 142. As shown in FIG. 5 and FIG. 6, the openings 142 of the light blocking layer 136 are generally L-shaped. This will be described more specifically. Each pixel 108 includes four sub pixels, namely, two sub pixels in a row direction by two sub pixels in a column direction. Each sub pixel is rectangular, and two sides of this rectangle are respectively in contact with one side of two rectangles congruent with the first rectangle. In this embodiment, the sub pixels are rectangular. The sub pixels are not limited to being rectangle. In this specification, the terms "rectangle" and "rectangular" encompass "square".

Naturally, the generally L-shaped openings 142 may be arranged point-symmetrically and also line-symmetrically as shown in FIG. 5 or may be arranged merely point-symmetrically, namely, arranged in a so-called windmill shape as shown in FIG. 6.

In this embodiment, the openings 142 are polygonal. The shape of the openings 142 is not limited to being polygonal. In addition, it is not necessary that two straight lines make an angle at an apex, and apexes may form curved lines having a certain curvature.

In this embodiment, four openings included in one pixel are each divided into a plurality of openings, and the plurality of openings allow light from the light emitting regions to be output. The number of openings included in one pixel is not limited to four, and a plurality of openings (may not be four openings; for example, three openings) included in one pixel may each be divided into a plurality of openings.

Sub Pixel Array Example 1

Figure 7:
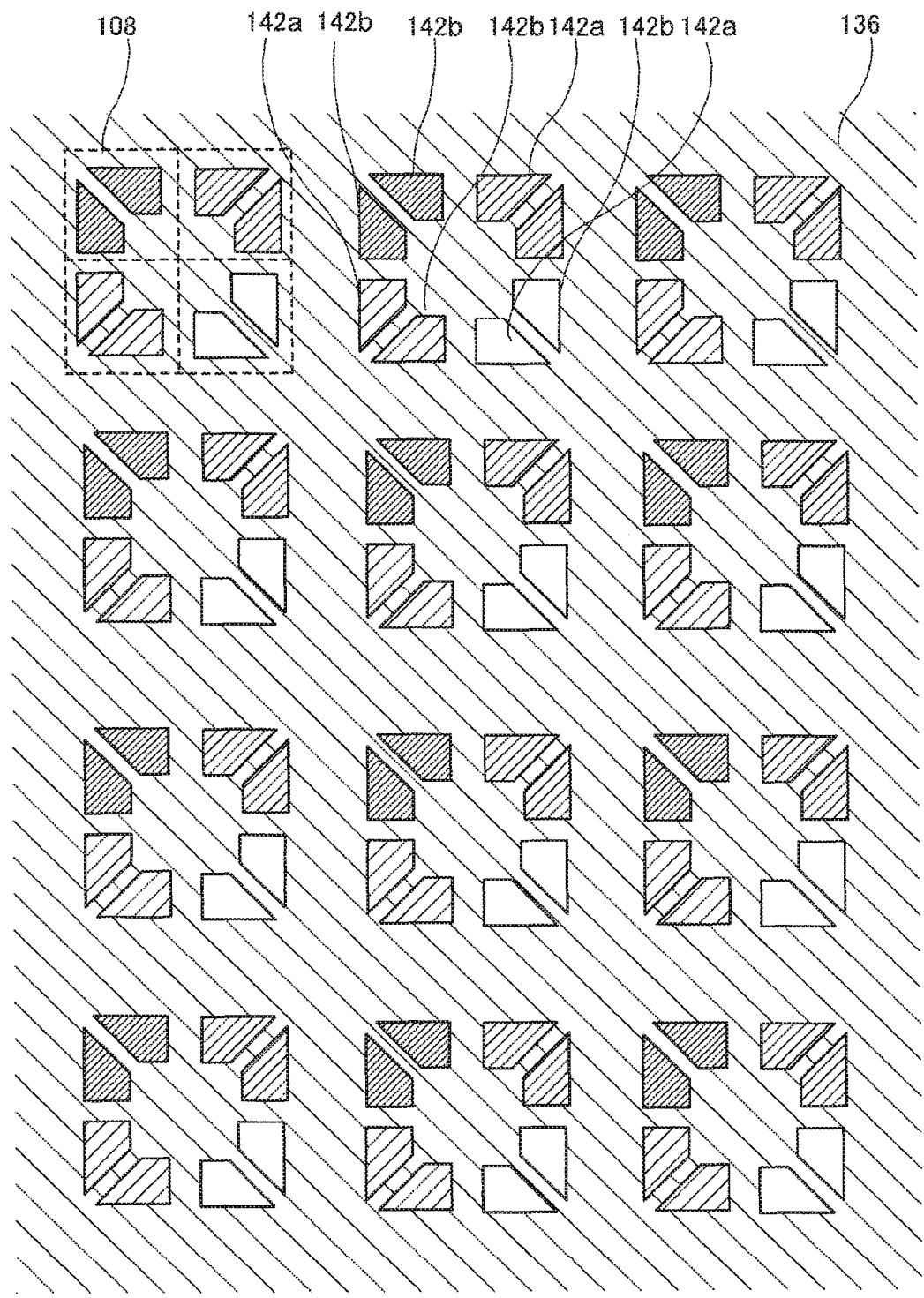
FIG. 7 is a plan view showing an array example of sub pixels in the display device in the embodiment according to the present invention.

With reference to FIG. 7, an array example of the sub pixels in the display device in the embodiment according to the present invention will be described. In FIG. 7, the sub pixels shown in FIG. 5 are each divided into sub pixel A and sub pixel B by a light blocking layer so that there are a plurality of openings allowing light from the light emitting regions to be output. In this example in which the sub pixels are each divided into sub pixel A and sub pixel B, the individual pixel electrodes 124 may not be each divided and may be common for the sub pixels A and B.

One opening 142*a* of sub pixel A and one opening 142*b* of sub pixel B are each asymmetrical in shape. However, the opening pitch is decreased by the division to increase the spatial frequency with respect to the reflected light. As a result, the contrast of the reflection rainbow caused by the reflection of the external light is decreased and the reflection rainbow is made difficult to be visually recognized. The "spatial frequency" is defined as the number of cycles per degree of the visual angle, and is expressed by the unit "cpd" (cycle per degree). In this specification, the "spatial frequency" is the number of cycles of openings per degree of the visual angle (or simply, the number of openings per degree of the visual angle). In addition, the state where the width of the openings significantly varies in accordance with the position is alleviated, and therefore, the viewing angle dependence of the reflection rainbow caused by the reflection of the external light is decreased. As shown in FIG. 7, in this example, at least a bending portion of the generally L-shaped light emitting region of each sub pixel is covered with a light blocking layer to divide the light emitting region into two light emitting regions. Thus, the sub pixel is divided (sub pixels A and B are demarcated).

Sub Pixel Array Example 2

Figure 8:
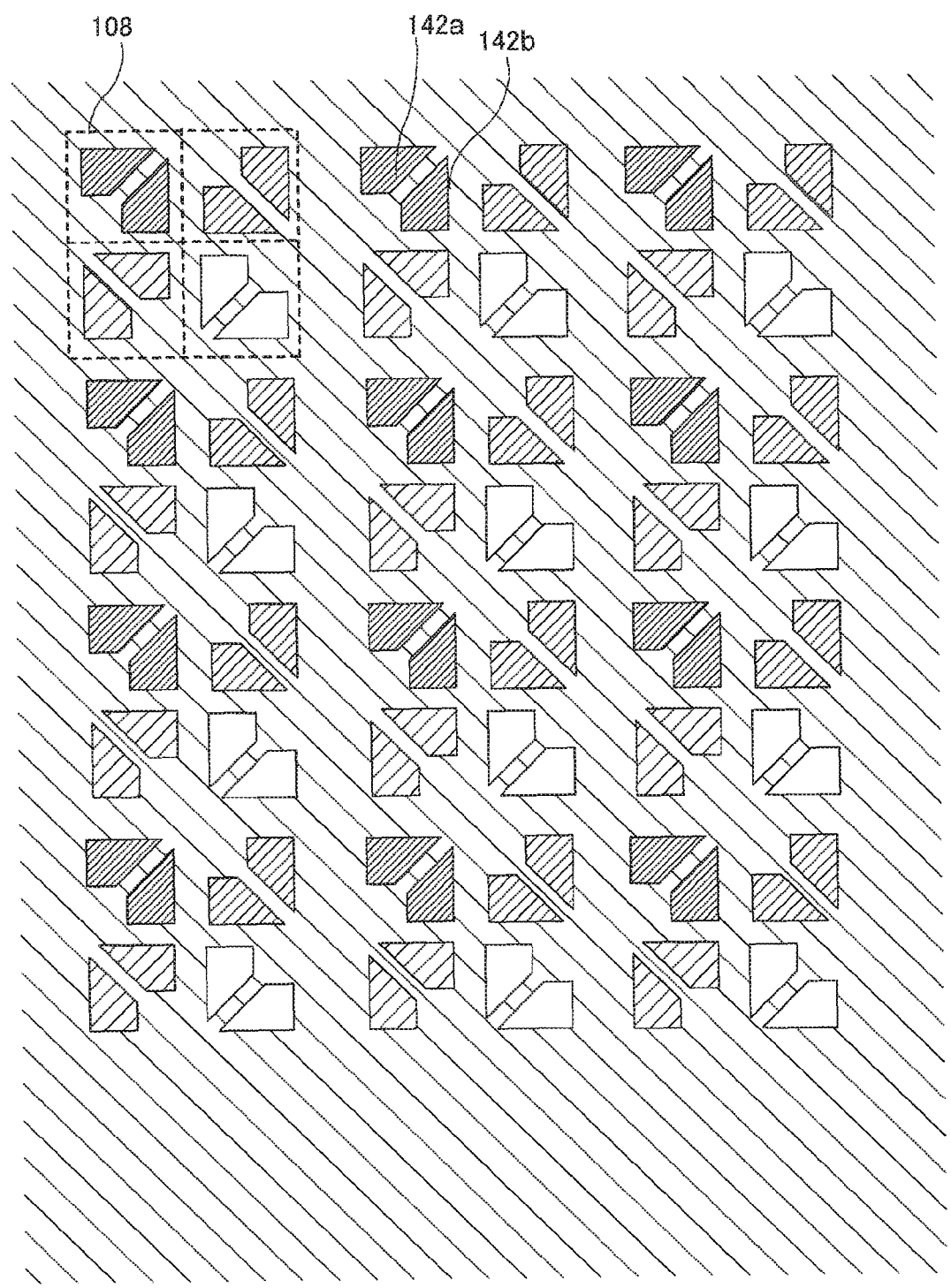
FIG. 8 is a plan view showing an array example of sub pixels in the display device in the embodiment according to the present invention.

With reference to FIG. 8, an array example of the sub pixels in the display device in the embodiment according to the present invention will be described. In FIG. 8, the sub pixels shown in FIG. 6 are each divided into sub pixel A and sub pixel B by a light blocking layer so that there are a plurality of openings allowing light from the light emitting regions to be output.

One opening 142*a* of sub pixel A and one opening 142*b* of sub pixel B are each asymmetrical in shape. However, the opening pitch is decreased to increase the spatial frequency with respect to the reflected light. As a result, the contrast of the reflection rainbow caused by the reflection of the external light is decreased and the reflection rainbow is made difficult to be visually recognized. In addition, the state where the width of the openings significantly varies in accordance with the position is alleviated, and therefore, the viewing angle dependence of the reflection rainbow caused by the reflection of the external light is decreased.

Sub Pixel Array Example 3

Figure 9:
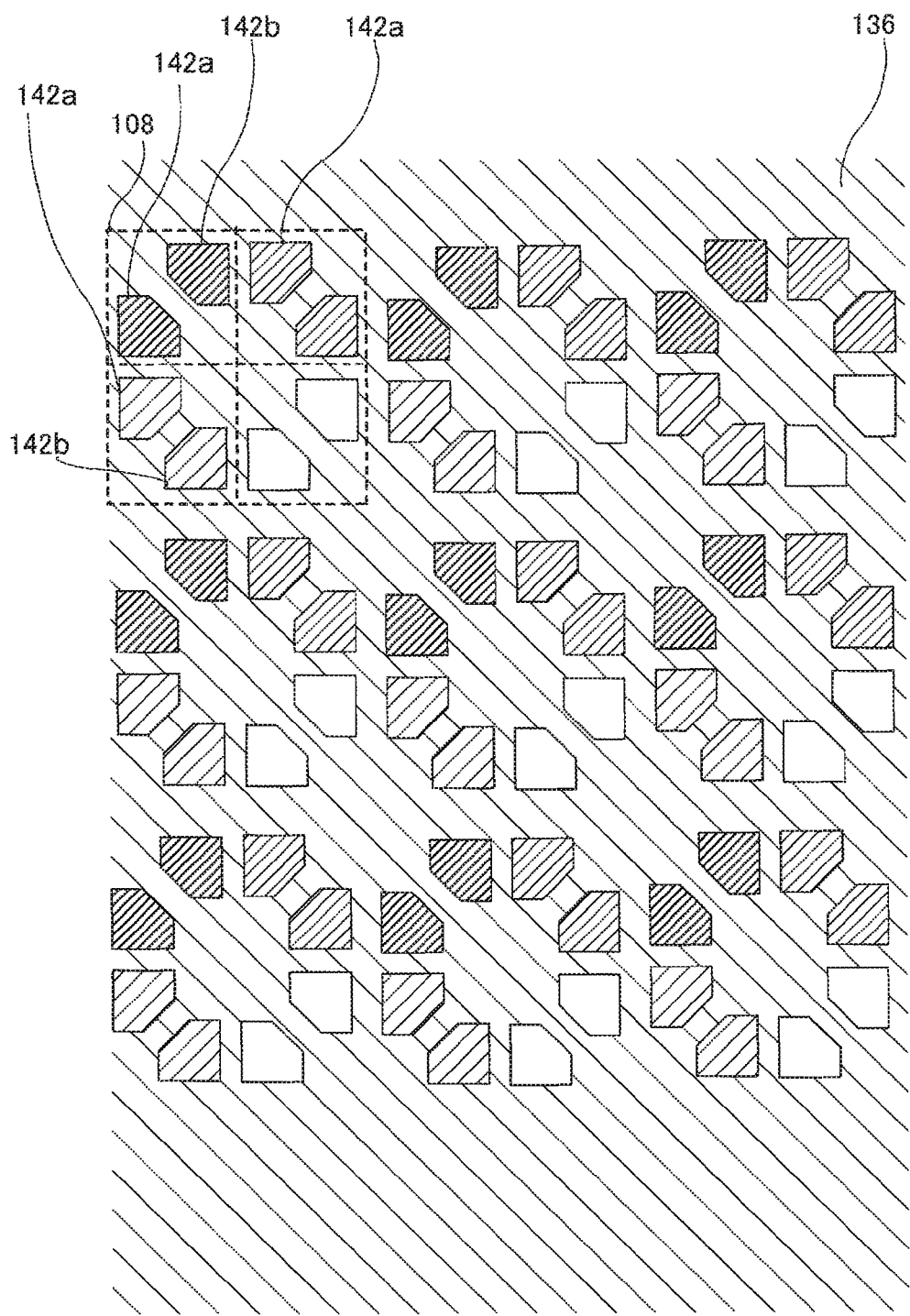
FIG. 9 is a plan view showing an array example of sub pixels in the display device in the embodiment according to the present invention.

With reference to FIG. 9, an array example of the sub pixels in the display device in the embodiment according to the present invention will be described. In FIG. 9, the sub pixels shown in FIG. 5 are each divided into sub pixel A and sub pixel B by a light blocking layer so that there are a plurality of openings allowing light from the light emitting regions to be output.

In this example, one opening 142*a* of sub pixel A and one opening 142*b* of sub pixel B are line-symmetrical in shape, more specifically diamond-shaped.

In this example, the openings are each line-symmetrical in shape. In addition, the opening pitch is decreased to increase the spatial frequency with respect to the reflected light. As a result, the contrast of the reflection rainbow caused by the reflection of the external light is decreased and the reflection rainbow is made difficult to be visually recognized. In addition, the state where the width of the openings significantly varies in accordance with the position is alleviated, and therefore, the viewing angle dependence of the reflection rainbow caused by the reflection of the external light is decreased.

Sub Pixel Array Example 4

Figure 10:
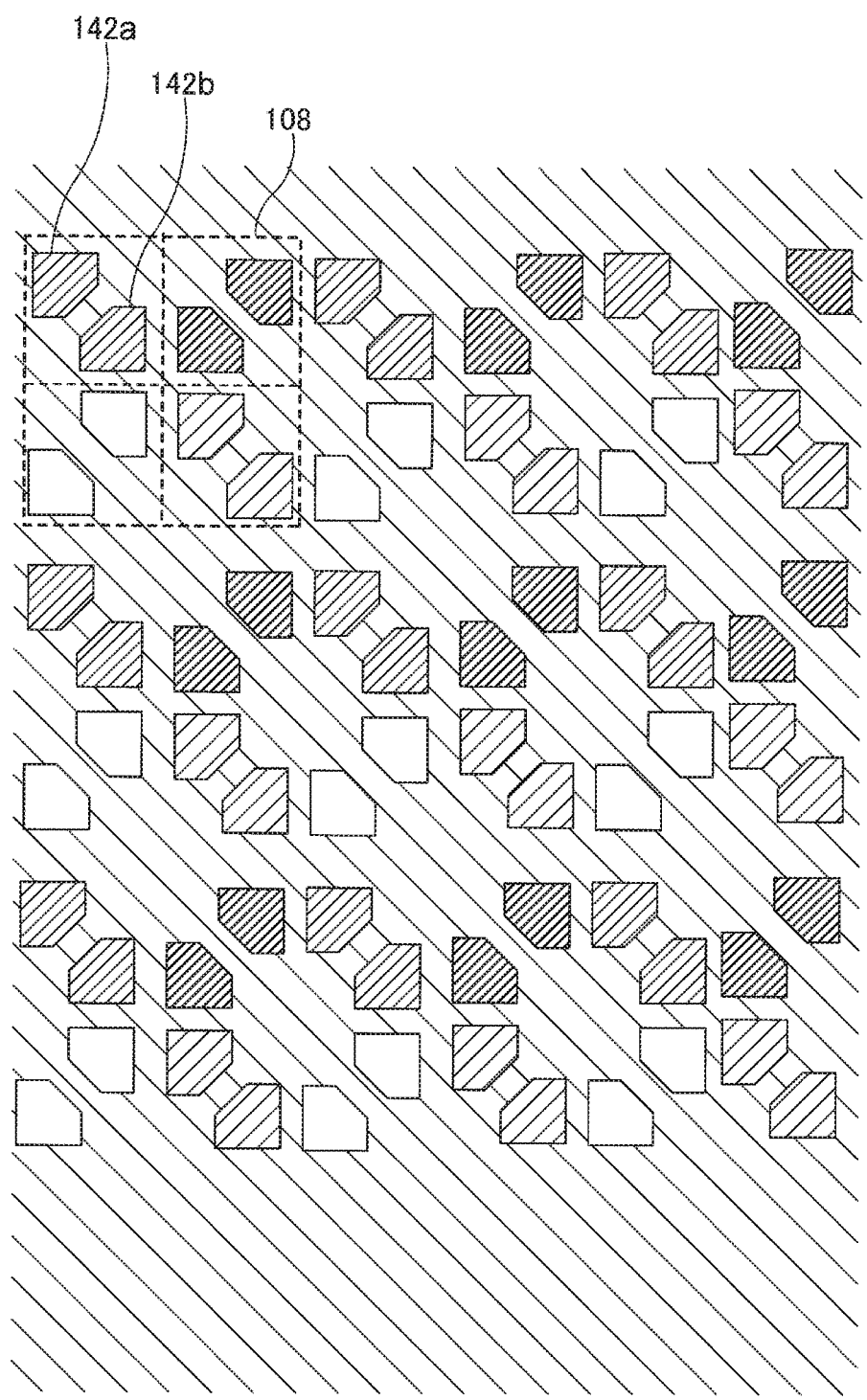
FIG. 10 is a plan view showing an array example of sub pixels in the display device in the embodiment according to the present invention.

With reference to FIG. 10, an array example of the sub pixels in the display device in the embodiment according to the present invention will be described. In FIG. 10, the sub pixels shown in FIG. 6 are each divided into sub pixel A and sub pixel B by a light blocking layer so that there are a plurality of openings allowing light from the light emitting regions to be output.

In this example, one opening 142*a* of sub pixel A and one opening 142*b* of sub pixel B are line-symmetrical in shape, more specifically diamond-shaped.

In this example, the openings are each line-symmetrical in shape. In addition, the opening pitch is decreased to increase the spatial frequency with respect to the reflected light. As a result, the reflection rainbow is further suppressed from being caused. Thus, the contrast of the reflection rainbow caused by the reflection of the external light is decreased and the reflection rainbow is made difficult to be visually recognized. In addition, the state where the width of the openings significantly varies in accordance with the position is alleviated because the openings are arranged line-symmetrically, and therefore, the viewing angle dependence of the reflection rainbow (viewing angle dependence of the image quality) caused by the reflection of the external light is decreased.

Sub Pixel Array Example 5

Figure 11:
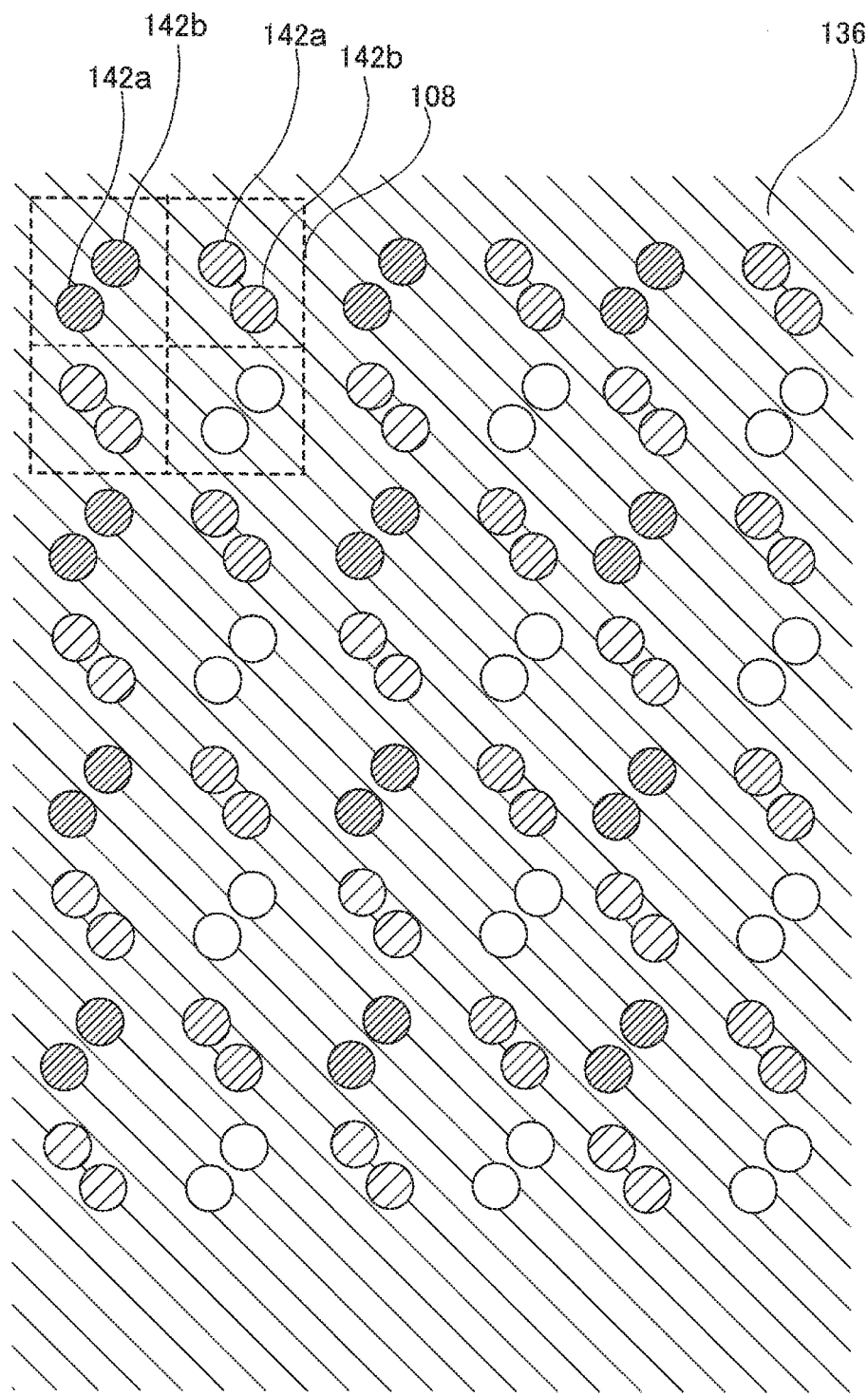
FIG. 11 is a plan view showing an array example of sub pixels in the display device in the embodiment according to the present invention.

With reference to FIG. 11, an array example of the sub pixels in the display device in the embodiment according to the present invention will be described. In FIG. 11, the sub pixels are each divided into sub pixel A and sub pixel B by a light blocking layer so that there are a plurality of openings allowing light from the light emitting regions to be output.

In this example, one opening 142*a* of sub pixel A and one opening 142*b* of sub pixel B are generally circular. Therefore, the opening pitch is decreased to increase the spatial frequency with respect to the reflected light. As a result, the contrast of the reflection rainbow caused by the reflection of the external light is decreased and the reflection rainbow is made difficult to be visually recognized.

In this example, the opening pitch is decreased to increase the spatial frequency with respect to the reflected light. As a result, the reflection rainbow is further suppressed from being caused. Thus, the contrast of the reflection rainbow caused by the reflection of the external light is decreased and the reflection rainbow is made difficult to be visually recognized. In addition, the state where the width of the openings significantly varies in accordance with the position is alleviated because the openings are arranged point-symmetrically, and therefore, the viewing angle dependence of the reflection rainbow (viewing angle dependence of the image quality) caused by the reflection of the external light is decreased.

The terms "circular" and "generally circular" used in this example do not necessarily refer to a perfectly circular shape, and may refer to an elliptical shape. These terms are not limited to referring to a shape having a curvature, and may refer to a polygonal shape (e.g., octagon, dodecagon, etc.).

Sub Pixel Array Example 6

Figure 12:
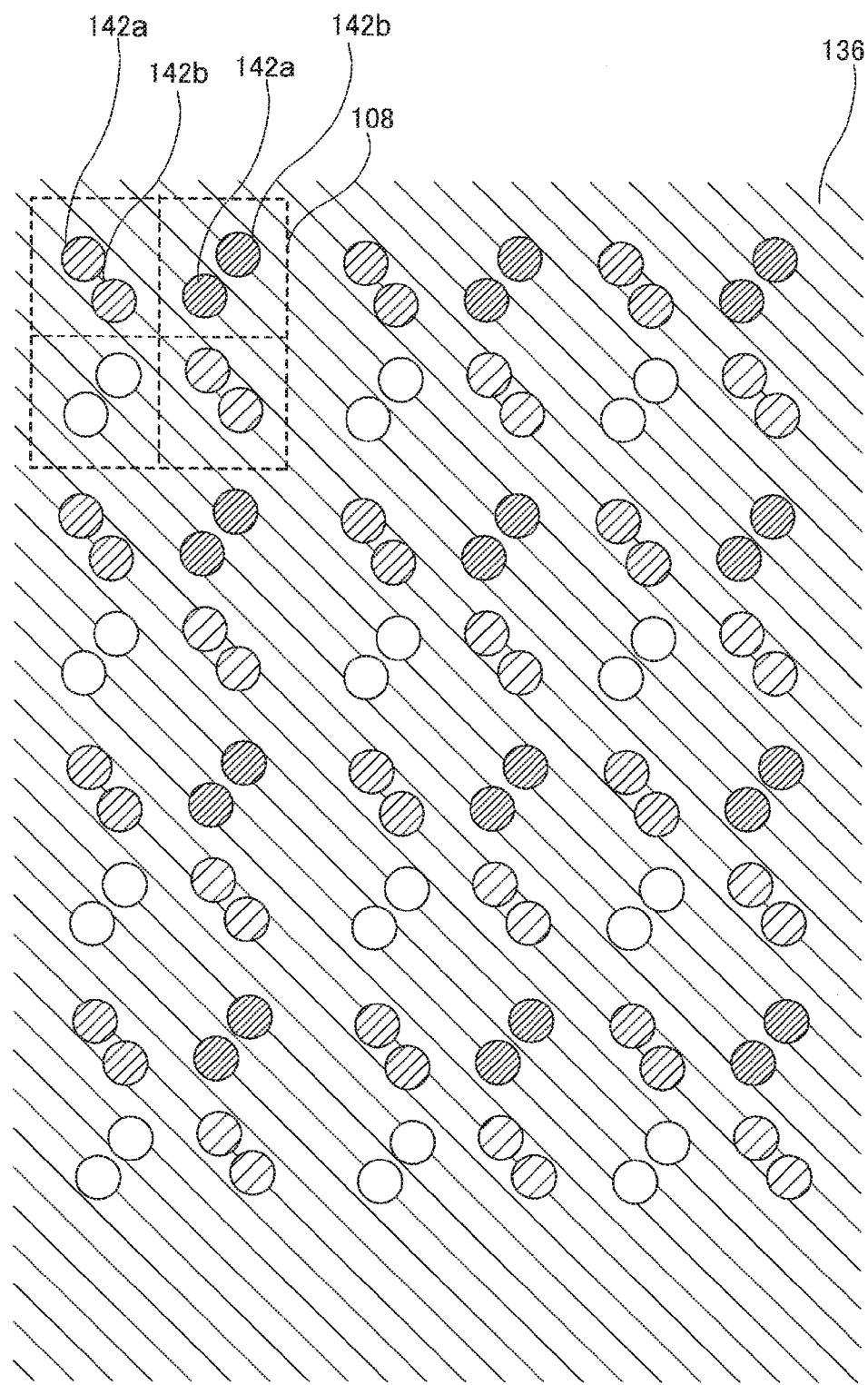
FIG. 12 is a plan view showing an array example of sub pixels in the display device in the embodiment according to the present invention.

With reference to FIG. 12, an array example of the sub pixels in the display device in the embodiment according to the present invention will be described. In FIG. 12, the sub pixels are each divided into a plurality of sub pixels by a light blocking layer so that there are a plurality of openings allowing light from the light emitting regions to be output. In this example, the openings are generally circular.

In this example, the opening pitch is decreased to increase the spatial frequency with respect to the reflected light. As a result, the reflection rainbow is further suppressed from being caused. Thus, the contrast of the reflection rainbow caused by the reflection of the external light is decreased and the reflection rainbow is made difficult to be visually recognized. In addition, the state where the width of the openings significantly varies in accordance with the position is alleviated because the openings are arranged point-symmetrically, and therefore, the viewing angle dependence of the reflection rainbow (viewing angle dependence of the image quality) caused by the reflection of the external light is decreased.

The terms "circular" and "generally circular" used in this example do not necessarily refer to a perfectly circular shape, and may refer to an elliptical shape. These terms are not limited to referring to a shape having a curvature, and may refer to a polygonal shape (e.g., octagon, dodecagon, etc.).

Sub Pixel Array Example 7

Figure 13:
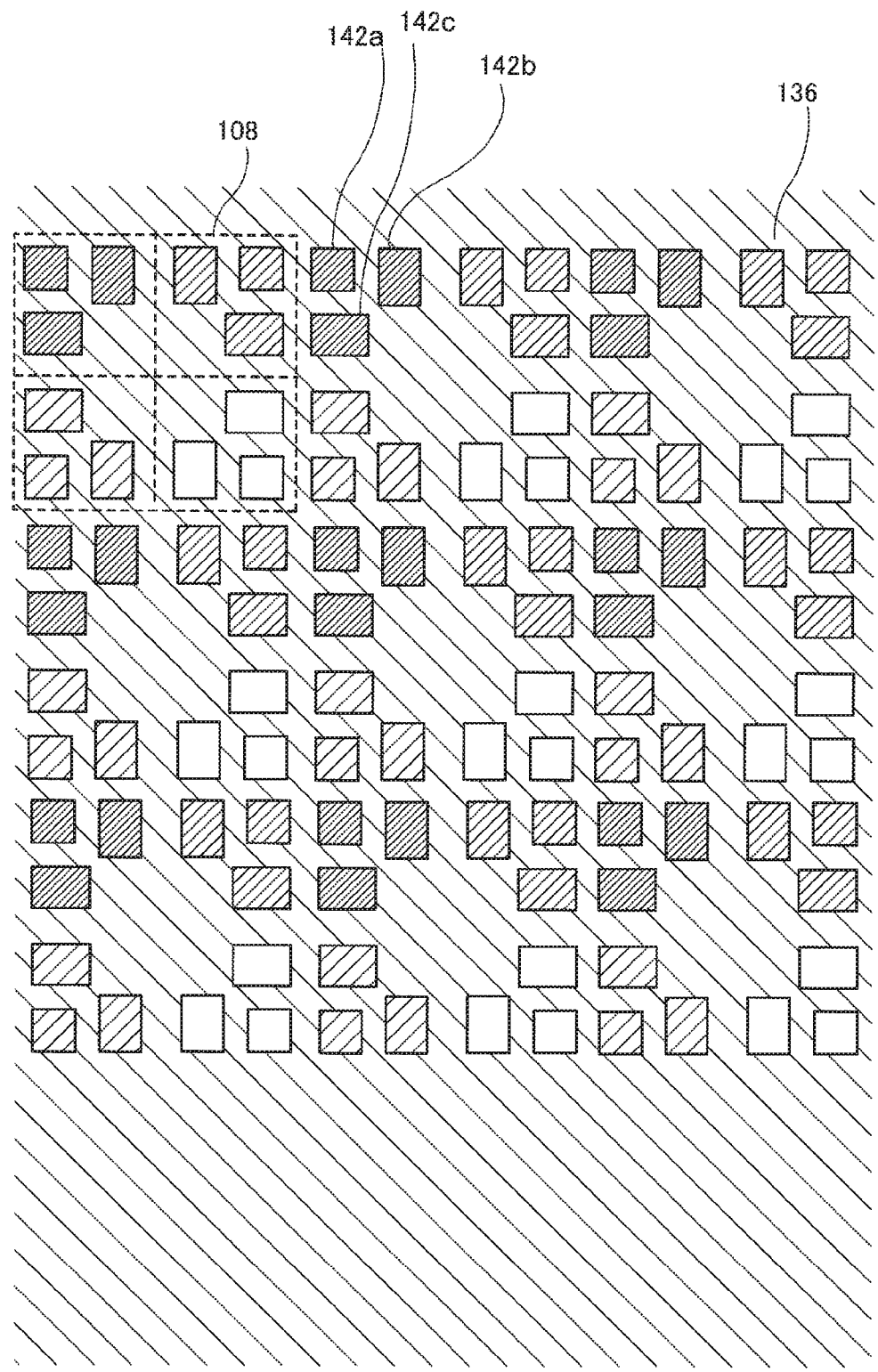
FIG. 13 is a plan view showing an array example of sub pixels in the display device in the embodiment according to the present invention.

With reference to FIG. 13, an array example of the sub pixels in the display device in the embodiment according to the present invention will be described. In FIG. 13, the sub pixels are each divided into a plurality of sub pixels by a light blocking layer so that there are a plurality of openings allowing light from the light emitting regions to be output. In this example, each sub pixel is divided so as to have three quadrangular openings.

In this example, as compared with the example in which one sub pixel is divided into two, the opening pitch is further decreased to further increase the spatial frequency with respect to the reflected light. As a result, the reflection rainbow is still further suppressed from being caused. Thus, the contrast of the reflection rainbow caused by the reflection of the external light is further decreased and the reflection rainbow is made more difficult to be visually recognized. In addition, the state where the width of the openings significantly varies in accordance with the position is alleviated because the openings are arranged point-symmetrically, and therefore, the viewing angle dependence of the reflection rainbow (viewing angle dependence of the image quality) caused by the reflection of the external light is decreased.

Sub Pixel Array Example 8

Figure 14:
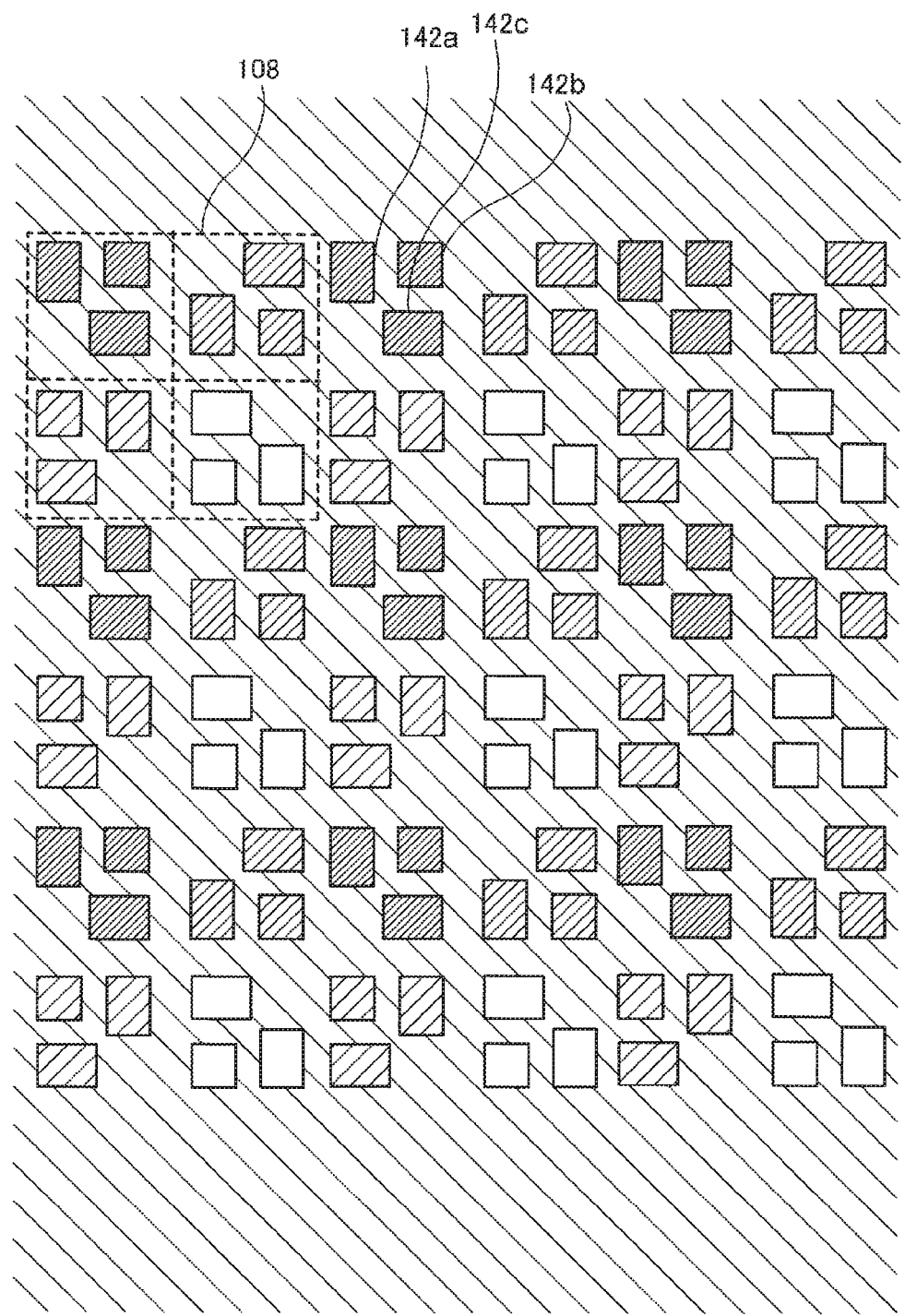
FIG. 14 is a plan view showing an array example of sub pixels in the display device in the embodiment according to the present invention.

With reference to FIG. 14, an array example of the sub pixels in the display device in the embodiment according to the present invention will be described. In FIG. 14, the sub pixels are each divided into a plurality of sub pixels by a light blocking layer so that there are a plurality of openings allowing light from the light emitting regions to be output. In this example, each sub pixel is divided so as to have three quadrangular openings.

In this example, the opening pitch is decreased to increase the spatial frequency with respect to the reflected light. As a result, the reflection rainbow is further suppressed from being caused. Thus, the contrast of the reflection rainbow caused by the reflection of the external light is decreased and the reflection rainbow is made difficult to be visually recognized. In addition, the state where the width of the openings significantly varies in accordance with the position is alleviated because the openings are arranged point-symmetrically, and therefore, the viewing angle dependence of the reflection rainbow (viewing angle dependence of the image quality) caused by the reflection of the external light is decreased.

The term "quadrangular" used in this example may refer to a quadrangular shape having a rounded or chamfered corner.

Sub Pixel Array Example 9

Figure 15:
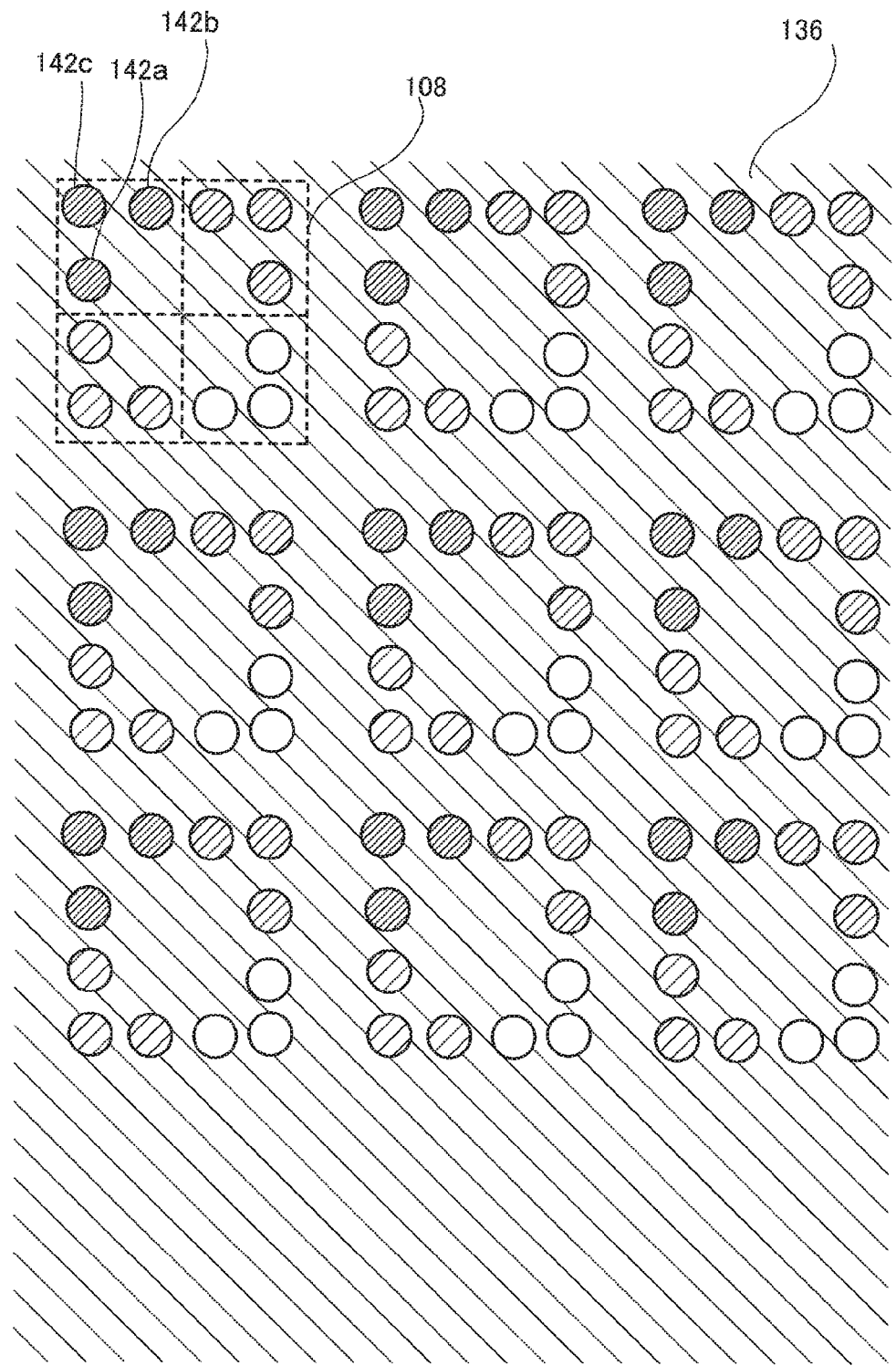
FIG. 15 is a plan view showing an array example of sub pixels in the display device in the embodiment according to the present invention.

With reference to FIG. 15, an array example of the sub pixels in the display device in the embodiment according to the present invention will be described. In FIG. 15, the sub pixels are each divided into a plurality of sub pixels by a light blocking layer so that there are a plurality of openings allowing light from the light emitting regions to be output. In this example, each sub pixel is divided so as to have three circular openings.

In this example, the opening pitch is decreased to increase the spatial frequency with respect to the reflected light. As a result, the reflection rainbow is further suppressed from being caused. Thus, the contrast of the reflection rainbow caused by the reflection of the external light is decreased and the reflection rainbow is made difficult to be visually recognized. In addition, the state where the width of the openings significantly varies in accordance with the position is alleviated because the openings are arranged point-symmetrically, and therefore, the viewing angle dependence of the reflection rainbow (viewing angle dependence of the image quality) caused by the reflection of the external light is decreased.

Sub Pixel Array Example 10

Figure 16:
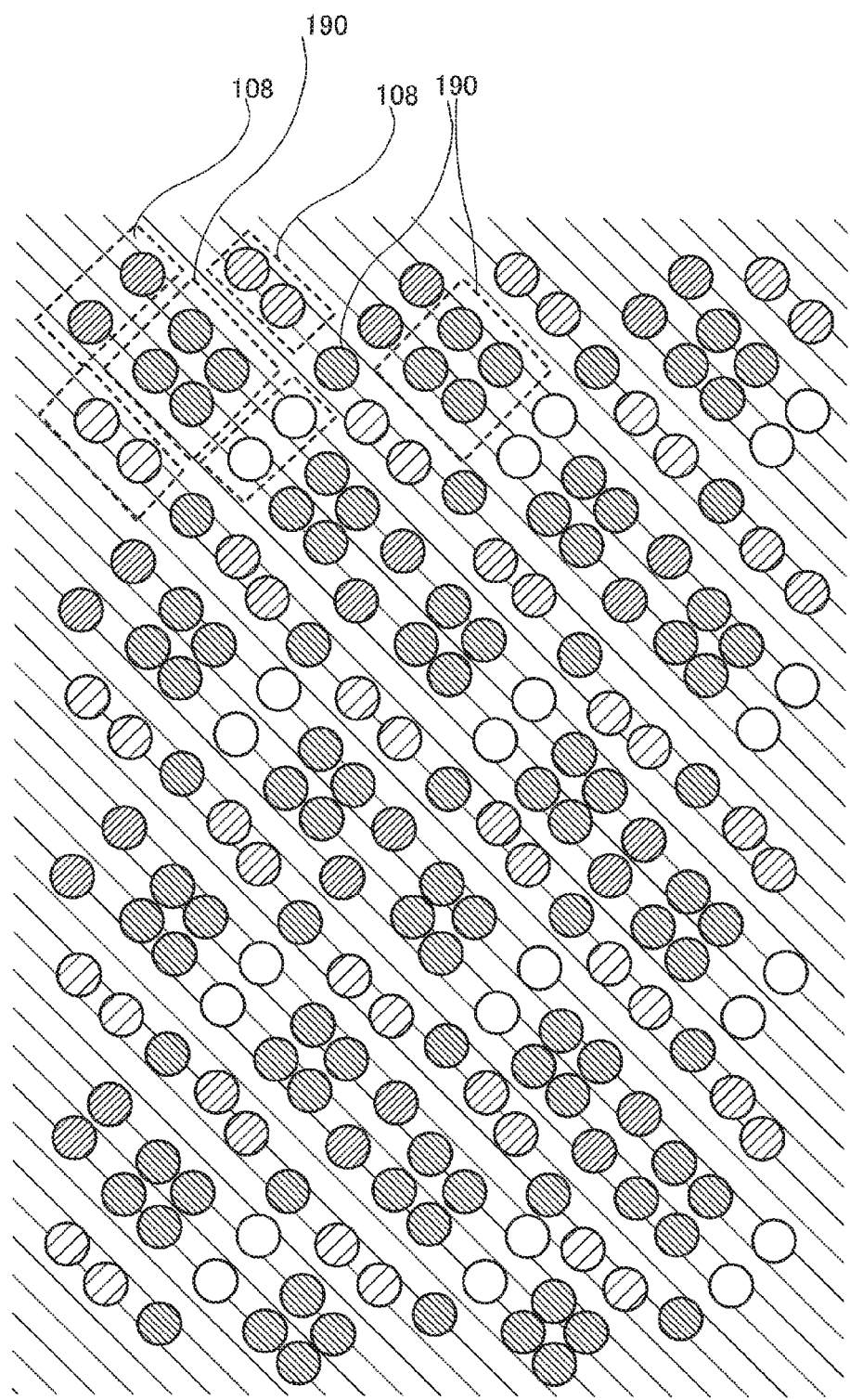
FIG. 16 is a plan view showing an array example of sub pixels in the display device in the embodiment according to the present invention.

In FIG. 16, the sub pixels are each divided into a plurality of sub pixels by a light blocking layer so that there are two circular openings allowing light from the light emitting regions to be output, and also dummy openings 190 having a size close to the size of the circular openings.

Conventionally, a light blocking layer is used to block light against a non-light emitting region in order to prevent light leak or color mixing between pixels. In this embodiment, the light blocking layer is used in order to increase the spatial frequency as well as to prevent light leak or color mixing between pixels.

In this example, the presence of the dummy openings 190 allows the opening pitch to be further decreased as compared with in the case where there are a plurality of openings in each sub pixel. Therefore, the spatial frequency with respect to the reflected light is increased. As a result, the reflection rainbow is further suppressed from being caused. Thus, the contrast of the reflection rainbow caused by the reflection of the external light is decreased and the reflection rainbow is made difficult to be visually recognized. In addition, the state where the width of the openings significantly varies in accordance with the position is alleviated because the openings are arranged point-symmetrically and the opening pitch is kept the same. Therefore, the viewing angle dependence of the reflection rainbow (viewing angle dependence of the image quality) caused by the reflection of the external light is decreased.

In this example, the plurality of dummy openings 190 provided as a measure against deterioration of visual recognizability, which would otherwise be caused by reflection of the external light, are circular. One dummy opening 190 is provided for one sub pixel 144; in other words, one dummy opening 190 is located between every two sub pixels 144 adjacent in a vertical direction, and one dummy opening 190 is located between every two sub pixels 144 adjacent in a horizontal direction. It should be noted that the shape, positions and the number of the dummy openings 190 are not limited to those in this example.

The dummy openings 190 in this example may be used in any of sub pixel array examples 1 through 9.

Another Embodiment

In another embodiment according to the present invention, the size of an area demarcated by the bank 130 may be approximately the same, or larger than, a total size of the openings, corresponding to the area, of the light blocking layer.

This structure allows light to be extracted from most of the light emitting regions. This provides an effect of realizing a display device having a higher efficiency.

As shown in FIG. 3, the bank 130 covers the peripheral area of the individual pixel electrode 124. The light emitting layer 128 and the common pixel electrode 126 are provided on a top surface of the individual pixel electrode 124 and a top surface of the bank 130. In the light emitting element 120, a region where the individual pixel electrode 124, the light emitting layer 128 and the common pixel electrode 126 overlap each other may be regarded as a light emitting region. The bank 130 isolates the light emitting layer 128 and the common pixel electrode 126 from the individual pixel electrode 124 at the peripheral area of the individual pixel electrode 124. Because of this structure, the bank 130 may be regarded as demarcating the light emitting region.

The bank 130 may be formed of an organic material such as, for example, an acrylic resin or a polyimide resin, or an inorganic material such as, for example, $SiO_2$ or SiN.

The bank 130 in this embodiment may be usable in any of sub pixel array examples 1 through 9.

The display device 100 in a preferable embodiment according to the present invention has been described. In this embodiment, the display device 100 providing high definition display is provided.

The above-described embodiments and examples are merely examples, and the technological scope of the present invention is not limited to any of the above-described embodiments or examples. A person of ordinary skill in the art would make various alterations without departing from the gist of the present invention. Therefore, such alterations are to be construed to be encompassed in the technological scope of the present invention.

The invention claimed is:

1. A display device, comprising:
a substrate;
a pixel including a plurality of sub pixels each including a light emitting region, the pixel being provided on the substrate;
a bank demarcating the plurality of sub pixels and exposing the light emitting regions; and
a light blocking layer located on an opposite side of the pixel from the substrate;
wherein:
the light emitting regions are L-shaped; and
the light blocking layer covers at least a bending portion of each of the light emitting regions and divides each of the light emitting regions into a plurality of regions, the bending portion making the light emitting regions L-shaped.

2. The display device according to claim 1, wherein:
the sub pixels included in the pixel are four rectangular sub pixels located in a matrix of two rows by two columns; and
each light emitting region included in each of the four sub pixels is located so as to have the bending portion facing a corner of the rectangular sub pixel, and is located along a part of an outer peripheral edge of the pixel.

3. The display device according to claim 1, wherein:
the sub pixels included in the pixel are four rectangular sub pixels located in a matrix of two rows by two columns;
the four sub pixels include:
a first sub pixel and a second sub pixel located on a first diagonal line of the pixel; and
a third sub pixel and a fourth sub pixel located on a second diagonal line of the pixel different from the first diagonal line;
a first light emitting region of the first sub pixel and a second light emitting region of the second sub pixel each include:
a first region extending in a first direction from an intersection of the first sub pixel and the second sub pixel;
the bending portion located at an end of the first region, the end being opposite to the intersection; and
a second region extending in a second direction crossing the first direction from the bending portion along an outer peripheral edge of the pixel; and
a third light emitting region of the third sub pixel and a fourth light emitting region of the fourth sub pixel each include:
a third region extending in the second direction from the intersection;
the bending portion located at an end of the third region, the end being opposite to the intersection; and
a fourth region extending in the first direction from the bending portion along the outer peripheral edge of the pixel.

4. The display device according to claim 1, further comprising:
a counter substrate facing the substrate; and
a color filter and the light blocking layer provided on the counter substrate;
wherein the light blocking layer is located between the color filter and the counter substrate.

5. The display device according to claim 1, wherein the light emitting region is divided into two line-symmetrical regions.

6. The display device according to claim 1, wherein the light blocking layer has openings at positions not overlapping the light emitting regions.

7. The display device according to claim 1, wherein:
the sub pixels each include a pixel electrode, a light emitting layer provided on the pixel electrode, and a common electrode provided on the light emitting layer; and
the pixel electrode overlaps the plurality of regions divided by the light blocking layer.

* * * * *